(12) United States Patent
Suzuki et al.

(10) Patent No.: US 6,494,667 B1
(45) Date of Patent: Dec. 17, 2002

(54) COMPONENT SUCTION METHOD

(75) Inventors: Hideo Suzuki, Hirakata (JP); Mamoru Inoue, Hirakata (JP); Takashi Ando, Kofu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/721,879

(22) Filed: Nov. 27, 2000

Related U.S. Application Data

(62) Division of application No. 09/125,511, filed as application No. PCT/JP97/00543 on Feb. 26, 1997, now Pat. No. 6,190,115.

(30) Foreign Application Priority Data

Feb. 26, 1996 (JP) .............................. 8-38086
Jul. 1, 1996 (JP) .............................. 8-170902

(51) Int. Cl.⁷ .............................. B65G 1/133
(52) U.S. Cl. .............................. 414/751.1
(58) Field of Search .............................. 414/800, 752.1, 414/403, 411, 416, 751.1, 749.1, 80; 29/740, 741

(56) References Cited

U.S. PATENT DOCUMENTS

| | | | |
|---|---|---|---|
| 4,494,902 A | | 1/1985 | Kuppens et al. |
| 4,979,868 A | * | 12/1990 | Ueda et al. .................. 414/786 |
| 5,310,301 A | | 5/1994 | Aono |
| 5,348,316 A | | 9/1994 | Lin |
| 6,152,506 A | * | 11/2000 | Narikiyo et al. ........... 294/64.1 |
| 6,225,130 B1 | * | 5/2001 | Kitajima et al. ............. 436/177 |

FOREIGN PATENT DOCUMENTS

| | | | |
|---|---|---|---|
| EP | 477 606 A1 | 4/1992 | |
| EP | 501 290 A1 | 9/1992 | |
| JP | 401209739 | * 8/1989 | .................. 269/21 |

* cited by examiner

*Primary Examiner*—Richard Chilcot
*Assistant Examiner*—Andrew Joseph Rudy
(74) *Attorney, Agent, or Firm*—Wenderoth, Lind & Ponack, L.L.P.

(57) ABSTRACT

A component suction method including feeding components (8) accommodated in component storage spaces (9c) of a tape base (9a) to a predetermined position, lowering a nozzle (7) capable of sucking the components supplied to the predetermined position, stopping the nozzle (7) at a predetermined distance from an upper surface of the tape base, pushing an undersurface of the component up when the nozzle is at a bottom dead center position or a position adjacent to the center, vacuum-sucking the component by the nozzle at the bottom dead center position or at the position adjacent to the center, and moving the component sucked by the nozzle to a predetermined position of a board after the vacuum-sucking.

12 Claims, 19 Drawing Sheets

COMPONENT SUCTION METHOD

This is a divisional application of Ser. No 09/125,511, filed Aug. 20, 1998 now U.S. Pat. No. 6,190,115 which is a 371 of PCT/JP97/00543, filed Feb. 26, 1997.

TECHNICAL FIELD

The present invention relates to a component suction method and more particularly, to a method in various ways of usage for sucking components accommodated in components storage sections of a tape base and supplied to a predetermined position with a predetermined distance and mounting the components to electronic circuit boards, by way of vacuum suction with the use of descended nozzles.

BACKGROUND ART

A conventional sucking method will be described with reference to FIGS. 14–21. In a mounting apparatus in FIG. 14, a taping component (component assembly) 9 consists of component storage sections 9c for storing components 8 which are formed in a longitudinal direction of a tape base 9a with a predetermined pitch, and a covering film 9b for covering the storing sections 9c. The taping component 9, which is wound around a reel 22, is held by a tape cassette device 50, taken out along an upper surface of a component feed guide 20 and sent to a component feed opening 40 of a retainer cover 30 over a front end part of the feed guide 20. In the middle of the transfer, the covering film 9b is drawn out from a slit 24 notched from one side before the feed opening 40 of the retainer cover 30, and the covering tape 9b is separated from the tape base 9a and taken up around a reel 36. As a result, the component storage sections 9c in the tape base 9a are exposed. Although the tape base 9a is sent with exposed the component storage sections 9c to the component feed opening 40, the component storage sections 9c are covered with the retainer cover 30, and thus the components are prevented from popping outside and can be stably sent to the component feed opening 40.

The retainer cover 30 has a shutter 32 for preventing the component 8 from popping outside unexpectedly. The shutter 32 is provided so as to, in accordance with the feed operation of the component 8, open/close an upper surface of the component feed opening 40. The shutter 32 is opened only when the component is to be taken out by a suction nozzle (nozzle) 7 or the like. Therefore, the component can be taken out in a proper posture by the suction nozzle 7.

In the meantime, the suction nozzle 7 descends only when the component 8 is to be taken out, as shown in FIGS. 16, 17, and 21. The suction nozzle stops at a position in contact with an upper surface of the tape base 9a to vacuum-suck the component 8. Thereafter, the suction nozzle 7 moves up to a predetermined position and detects whether the component 8 is sucked properly. The suction nozzle 7 then moves over a board 60 and mounts the component 8 to a predetermined position of the board 60.

In the conventional sucking method described above, since a lower surface 7a of each suction nozzle 7 contacts the upper surface of the tape base 9a when the nozzle vacuum-sucks the component as shown in FIG. 17, the component storage section 9c is closed and the whole space is nearly equally reduced in pressure. A pressure difference between an upper and a lower surfaces of the component 8 is consequently small, that is, the applied force for floating the component 8 is small. In other words, a suction force of the suction nozzle 7 is decreased, and thereby a suction failure (e.g., a so-called standing suction shown in FIG. 19 or a so-called mis-suction shown in FIG. 20, etc.) is caused. The component 8 cannot be stably sucked by the suction nozzle 7. The same applies also to the case where the component 8 is pressed up from below by a push pin 10 at the component feed opening 40, making it difficult for the suction nozzle 7 to suck the component 8 stably (FIGS. 19 and 20).

FIG. 18 indicates a relation between a time and a distance of the lower surface 7a of the nozzle and the upper surface of the tape base 9a. The component 8 is sucked when the lower surface 7a of the nozzle moves from a point F to a point G. A time, $t_1$ which is allowed for the nozzle 7 to suck one component is approximately 0.005 sec. The time $t_1$ becomes shorter when a time after the component 8 is sucked before the component is mounted is required to be reduced, and thus suction failures are brought about more often.

Further, as the printed circuit boards are increasingly made more compact these days, mounting of micro components (1.0 mm long×0.5 mm wide×0.35 mm high or 0.6 mm long×0.3 mm wide×0.3 mm high components) is strongly required, which necessitates a reduced volume of the component storage sections 9c of. However, when these micro components are sucked, the force to float the component is hardly generated because of the micro size.

SUMMARY OF INVENTION

Accordingly, an object of the present invention is to solve the above-described conventional issues and to provide a method for sucking a component stably by a suction nozzle.

In accomplishing this and other objects, according to one aspect of the present invention, there is provided a component suction method comprising:

feeding one of components accommodated in component storage sections of a tape base to a predetermined component sucking position;

lowering a nozzle capable of sucking the one of the components supplied to the component sucking position;

stopping the nozzle with a predetermined distance from an upper surface of the tape base;

pushing an undersurface of the component up when the nozzle is stopped;

vacuum-sucking the component by the nozzle at a position where the nozzle is stopped; and moving the component sucked by the nozzle to a predetermined position of a board after the vacuum-sucking.

According to a second aspect of the present invention, there is provided a component suction method comprising:

feeding one of components accommodated in component storage sections of a tape base to a predetermined component sucking position;

lowering a nozzle capable of sucking the component supplied to the component sucking position;

stopping the nozzle with a predetermined distance from an upper surface of the tape base;

vacuum-sucking the component by the nozzle at a position where the nozzle is stopped; and moving the component sucked by the nozzle to a predetermined position of a board after the vacuum-sucking.

According to a third aspect of the present invention, there is provided a component suction method according to the first or second aspect, wherein the nozzle stops with a distance of 0.02–0.30 mm from the upper surface of the tape base.

According to a fourth aspect of the present invention, there is provided a component suction method according to the first, second, or third aspect, wherein the position where the nozzle is stopped is obtained beforehand by calculating from a size of the tape base so that the nozzle stops with the predetermined distance from the upper surface of the tape base.

According to a fifth aspect of the present invention, there is provided a component suction method according to the first, second, or third aspect, wherein a projecting part is provided at a lower surface of the nozzle, and a position where the projecting part contacts the upper surface of the tape base or is adjacent to the upper surface of the tape base is the bottom dead center of the nozzle.

According to a sixth aspect of the present invention, there is provided a component suction method comprising:

feeding one of components accommodated in component storage sections of a tape base to a predetermined component sucking position;

lowering a nozzle capable of sucking the component supplied to the predetermined component sucking position;

stopping the nozzle at a position where the nozzle contacts an upper surface of the tape base or becomes adjacent to the upper surface of the tape base;

pushing an undersurface of the component up when the nozzle is at a bottom dead center or a position adjacent to the center;

vacuum-sucking the component by the nozzle at the bottom dead center or the position adjacent to the center; and moving the component sucked by the nozzle to a predetermined position of a board after the vacuum-sucking, said method being so constituted as to let air into the component storage section through an air path formed in the tape base when the nozzle vacuum-sucks the component.

According to a seventh aspect of the present invention, there is provided a component suction method comprising:

feeding components accommodated in component storage sections of a tape base to a predetermined component sucking position;

lowering a nozzle capable of sucking the component supplied to the component sucking position;

stopping the nozzle at a position where the nozzle contacts an upper surface of the tape base or becomes adjacent to the upper surface of the tape base;

vacuum-sucking the component by the nozzle at a bottom dead center or a position adjacent to the center; and moving the component sucked by the nozzle to a predetermined position of a board after the vacuum-sucking, said method being so constituted as to let air into the component storage sections through an air path formed in the tape base when the nozzle vacuum-sucks the component.

According to an eighth aspect of the present invention, there is provided a component suction method according to the sixth or seventh aspect, wherein the component storage section of the tape base has a first space for accommodating the component and a second space communicating with the first space with a step difference and expanding outward beyond a face where the tape base contacts the nozzle, so that the second space becomes the air path.

According to a ninth aspect of the present invention, there is provided a component suction method according to the sixth or seventh aspect, wherein an air take-in groove leading to the component storage section is formed in the tape base, so that the air take-in groove becomes the air path.

According to a tenth aspect of the present invention, there is provided a component suction method according to the sixth or seventh aspect, wherein a hole communicating with the component storage section is formed before the nozzle vacuum-sucks the component, so that the hole becomes the air path.

According to an 11th aspect of the present invention, there is provided a component suction method according to the tenth aspect, wherein the hole is formed with use of a push pin pushing the undersurface of the component up.

According to a 12th aspect of the present invention, there is provided a component suction method comprising:

feeding one of components accommodated in component storage sections of a tape base to a predetermined component sucking position;

lowering a nozzle capable of sucking the component supplied to the component sucking position;

stopping the nozzle at a position where the nozzle contacts an upper surface of the tape base or becomes adjacent to the upper surface of the tape base;

pushing an undersurface of the component up when the nozzle is at a bottom dead center or a position adjacent to the center;

vacuum-sucking the component by the nozzle at the bottom dead center or the position adjacent to the center; and moving the component sucked by the nozzle to a predetermined position of a board after the vacuum-sucking, said method being so constituted as to let air into the component storage sections through an air path formed in the nozzle when the nozzle vacuum-sucks the component.

According to a 13th aspect of the present invention, there is provided a component suction method comprising:

feeding one of components accommodated in component storage sections of a tape base to a predetermined component sucking position;

lowering a nozzle capable of sucking the component supplied to the component sucking position;

stopping the nozzle at a position where the nozzle contacts an upper surface of the tape base or becomes adjacent to the upper surface of the tape base;

vacuum-sucking the component by the nozzle at a bottom dead center or a position adjacent to the center; and moving the component sucked by the nozzle to a predetermined position of a board after the vacuum-sucking, said method being so constituted as to let air into the component storage sections through an air path formed in the nozzle when the nozzle vacuum-sucks the component.

According to a 14th aspect of the present invention, there is provided a component suction method according to the 12th or 13th aspect, wherein a notched part connecting a side face with a bottom face of the nozzle is formed, so that the notched part becomes the air path.

According to a 15th aspect of the present invention, there is provided a component suction method according to the 12th or 13th aspect, wherein a hole connecting a side face with a bottom face of the nozzle is formed, so that the hole becomes the air path.

According to a 16th aspect of the present invention, there is provided a component suction method according to the 12th or 13th aspect, wherein an outer peripheral part of the nozzle is formed of a porous material, so that many through holes of the porous material are the air path.

According to a 17th aspect of the present invention, there is provided a component suction method comprising:

feeding one of components accommodated in component storage sections of a tape base to a predetermined component sucking position;

lowering a nozzle capable of sucking the component supplied to the component sucking position;

stopping the nozzle at a position where the nozzle contacts an upper surface of the tape base or becomes adjacent to the upper surface of the tape base;

pushing an undersurface of the component up when the nozzle is at a bottom dead center or a position adjacent to the center;

vacuum-sucking the component by the nozzle at the bottom dead center or the position adjacent to the center; and moving the component sucked by the nozzle to a predetermined position of a board after the vacuum-sucking, wherein the component storage section is so constituted as to produce a part not overlapping with an outline of a bottom face of the nozzle, so that air is let in the component storage section through the not overlapping part when the nozzle vacuum-sucks the component.

According to an 18th aspect of the present invention, there is provided a component suction method comprising:

feeding one of components accommodated in component storage sections of a tape base to a predetermined component sucking position;

lowering a nozzle capable of sucking the component supplied to the component sucking position;

stopping the nozzle at a position where the nozzle contacts an upper surface of the tape base or becomes adjacent to the upper surface of the tape base;

vacuum-sucking the component by the nozzle at a bottom dead center or a position adjacent to the center; and moving the component sucked by the nozzle to a predetermined position of a board after the vacuum-sucking, wherein the component storage section is so constituted as to produce a part not overlapping with an outline of a bottom face of the nozzle, so that air is let in the component storage section through the not overlapping part when the nozzle vacuum-sucks the component.

According to a 19th aspect of the present invention, there is provided a component assembly including a tape base having a plurality of component storage sections formed in a longitudinal direction, wherein an air path is formed in the tape base to let air into the component storage section when a nozzle vacuum-sucks a component stored in the component storage section.

According to a 20th aspect of the present invention, there is provided a component assembly according to the 19th aspect, wherein the component storage section of the tape base has a first space for storing the component and a second space communicating with the first space with a step difference and expanding outward beyond a face where the tape base contacts the nozzle, so that the second space is the air path.

According to a 21st aspect of the present invention, there is provided a component assembly according to the 19th aspect, wherein an air take-in groove leading to the component storage section is formed in the tape base, so that the air take-in groove is the air path.

According to a 22nd aspect of the present invention, there is provided a mounting apparatus having nozzles for vacuum-sucking components from component storage sections of a component feed device, holding the component and mounting the component to a predetermined position of a board, wherein an air path is formed in the nozzle to let air into the component storage section when the nozzle vacuum-sucks the component.

According to a 23rd aspect of the present invention, there is provided a mounting apparatus according to the 22nd aspect, wherein a notched part connecting a side face with a bottom face of the nozzle is formed in the nozzle to be the air path.

According to a 24th aspect of the present invention, there is provided a mounting apparatus according to the 22nd aspect, wherein a hole connecting a side face with a bottom face of the nozzle is formed in the nozzle to be the air path.

According to a 25th aspect of the present invention, there is provided a mounting apparatus according to the 22nd aspect, wherein an outer peripheral part of the nozzle is formed of a porous material, so that many through holes of the porous material are the air path.

According to a 26th aspect of the present invention, there is provided a component feed device which holds a component assembly including a tape base having a plurality of component storage sections formed in a longitudinal direction, wherein, by sending the tape base, components in the component storage sections are sequentially supplied to a predetermined component sucking position to be vacuum-sucked by nozzles, said device further comprising a boring member for forming a hole communicating with the component storage section in a lower surface of the tape base before the nozzle vacuum-sucks the component.

According to a 27th aspect of the present invention, there is provided a component feed device according to the 26th aspect, wherein a push pin for pushing up the undersurface of the component works also as the boring member.

Because of the process of stopping the nozzle at a predetermined distance away from the upper surface of the tape base in the above-described method, the air is able to easily enter the component storage section, which increases the pressure difference between upper and lower surfaces of the component and thereby a large force acts to float the component. Besides the above operation, in some of the aspects, since an undersurface of the component is pushed up from below simultaneously when the component is vacuum-sucked, the air is able to move easily enter the component storage section thereby increasing the force for floating the component. Accordingly, suction failures are markedly reduced and the components can be quickly and stably sucked.

On the other hand, there is an issue in that a highly accurate control is required to correctly position the bottom dead center of the nozzle so as to set the above distance and the accuracy is hard to maintain over a long period of time. In order to solve this issue, when the projecting part is provided at the lower surface of the nozzle in a manner to contact the upper surface of the tape base (or in a manner to be adjacent to the upper surface of the tape base in some cases) as in the above aspects, the bottom dead center of the nozzle can be easily controlled/positioned. Since the length of the projecting part becomes the above distance, the distance can be maintained highly accurately for a long time. When the tape base is cushioned, the cushioning can absorb errors in the bottom dead center of the nozzle, and ease shocks when the nozzle contacts the tape base.

In the method as described above, in a case where the air is let into the component storage section through the air path formed in the tape base when the nozzle vacuum-sucks the component, the air can easily to enter the component storage section, with a pressure difference increased between upper and lower surfaces of the component, and thus a large force acts to float the component. In the aspects, in addition to the above operation, in a case where the component is pushed up from below simultaneously when the component is vacuum-sucked, the air can even more easily enter the component storage section to increase the force for floating the component. Accordingly, suction failures can be prevented and a component can be quickly and stably sucked. When the bottom dead center of the nozzle is determined by bringing the lower surface of the nozzle into touch with the upper surface of the tape base (by bringing the lower surface of the nozzle to a position adjacent to the upper surface of the tape base in some cases), the bottom dead center can be easily controlled/positioned. When the tape base has cushioning, the cushioning can absorb errors in the bottom dead center of the nozzle and ease shocks when the nozzle comes in touch therewith.

In the above-described method, in a case where the air is let into the component storage section through the air path formed in the nozzle when the nozzle vacuum-sucks the component, the air can easily enter the component storage section, with the pressure difference increased between upper and lower surfaces of the component, and thus a large force acts to float the component. In addition to the above effect, according to the aspects, in a case where the component is pushed up from below simultaneously when the component is vacuum-sucked, the air can even more easily enter the component storage section to increase the force for floating the component. Accordingly, suction failures can be greatly prevented and a component can be quickly and stably sucked. In a case where the bottom dead center of the nozzle is determined by bringing the lower surface of the nozzle into touch with the upper surface of the tape base (by bringing the lower surface of the nozzle to a position adjacent to the upper surface of the tape base in some cases), the bottom dead center can be easily controlled/positioned. When the tape base has cushioning, the cushioning can absorb errors in the bottom dead center of the nozzle and ease shocks when the nozzles come in touch therewith.

In any of the above aspects, when the nozzle is provided with the air path, it allows the use of conventional tapes. In such a case, the components in the component storage sections can be protected from outside dust when the tape is stored or transported, etc. and it is only when the covering tape is detached immediately before the component is sucked and taken out that the foregoing action of the method is achieved. The components can thus be stored in a good state.

In a case where the air is let into the component storage section from the part of the component storage section not overlapping with the nozzle when the nozzle vacuum-sucks the component in the above-described method, the air can be easily sent into the component storage section, thereby increasing the pressure difference between upper and lower surfaces of the component to increase a force to float the component. In the aspects, in addition to this effect, in a case where the component is pushed up from below simultaneously when the component is vacuum-sucked, the force for floating the component can be increased more because of the facilitation of the air flow into the component storage section due to the push pin pushing the component up from below simultaneously when the component is vacuum-sucked. Accordingly, suction failures can be greatly prevented and a component can be quickly and stably sucked. According to the above method, in a case where the bottom dead center of the nozzle is determined by bringing the lower surface of the nozzle in touch with the upper surface of the tape base (by bringing the lower surface of the nozzle to a position adjacent to the upper surface of the tape base in some cases), the bottom dead center can be easily controlled/positioned. When the tape base has cushioning, the tape base can absorb errors in the bottom dead center of the nozzle and ease shocks when the nozzles contact therewith. Moreover, the above method is achieved by a simple method of changing a relative shape of the nozzle or component storage section.

The above component assembly makes it possible to execute the component suction method according to the above aspects smoothly, while accomplishing the above effects.

The component suction method according to the aspects is carried out smoothly with the use of the above mounting apparatus, while accomplishing the above effects.

When the above component feed device is used, the component suction method according to the aspects is executed smoothly, while accomplishing the above effects.

BRIEF DESCRIPTION OF DRAWINGS

These and other aspects and features of the present invention will become clear from the following description taken in conjunction with the preferred embodiments thereof with reference to the accompanying drawings, in which.

DETAILED DESCRIPTION OF THE INVENTION

Figure 1:
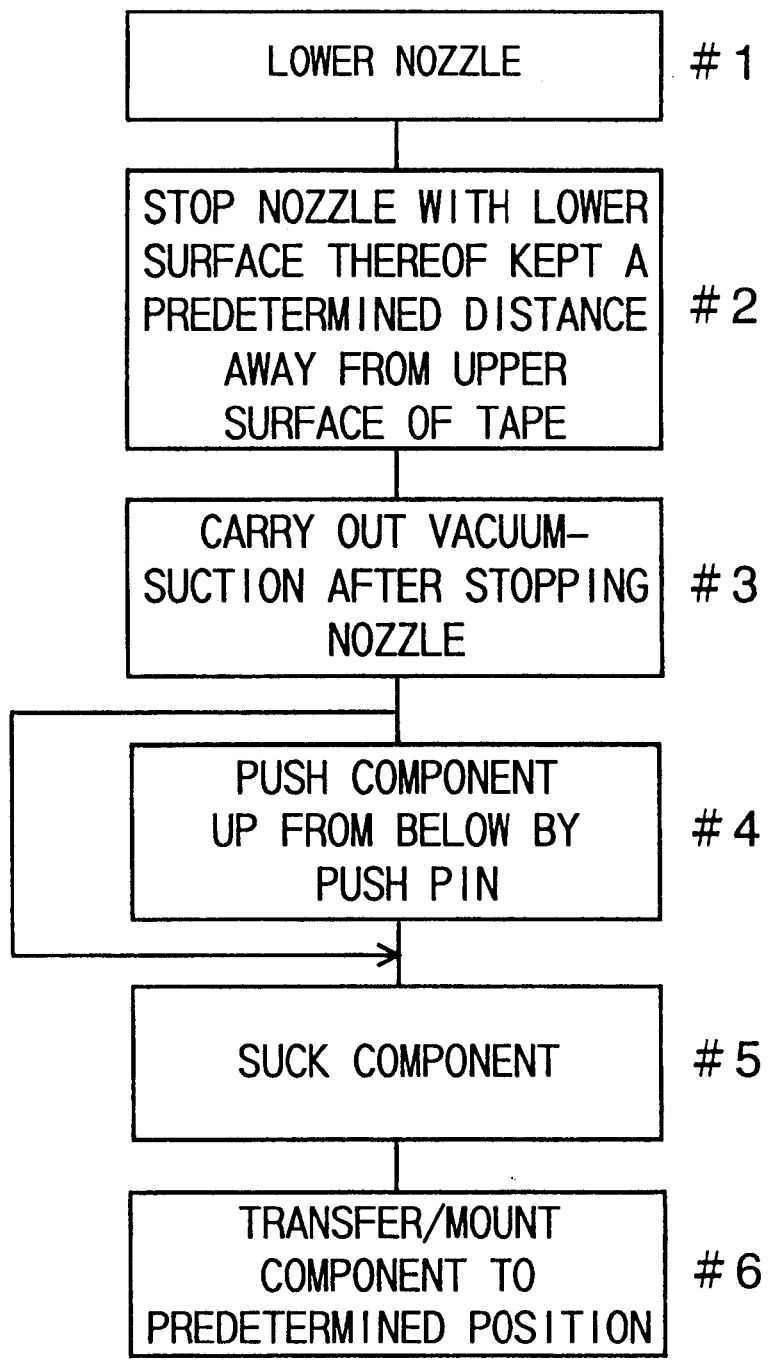
FIG. 1 is a flow chart showing an embodiment of a component suction method of the present invention.

Before the description of the present invention proceeds, it is to be noted that like parts are designated by like reference numerals throughout the accompanying drawings.

Figure 15A:
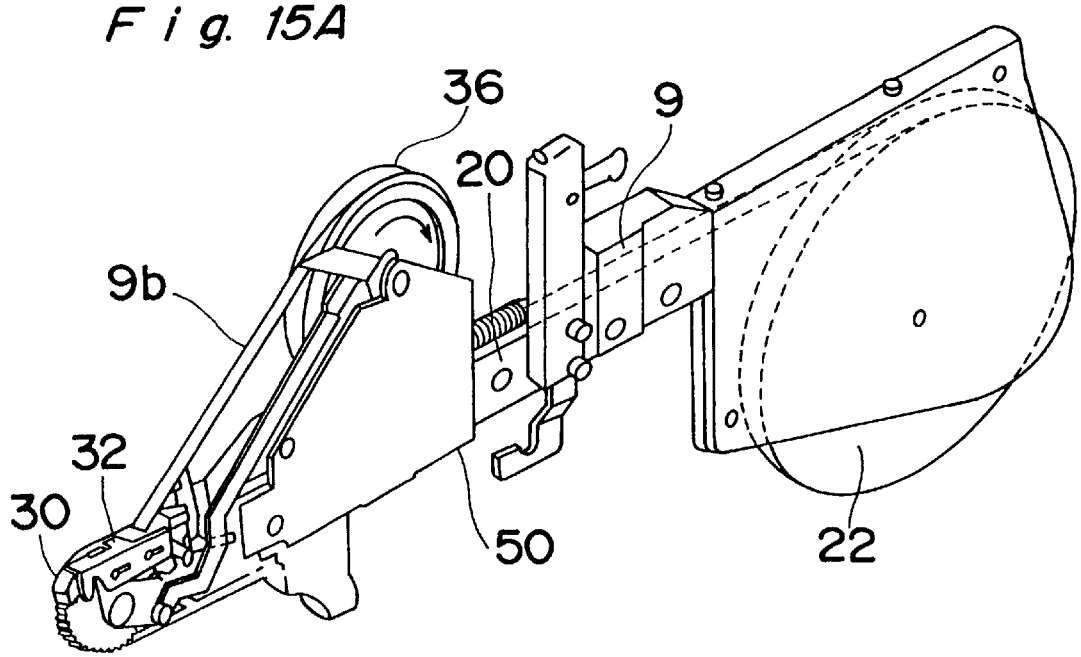
FIG. 15A is a perspective view of the component feed device.
Figure 15B:
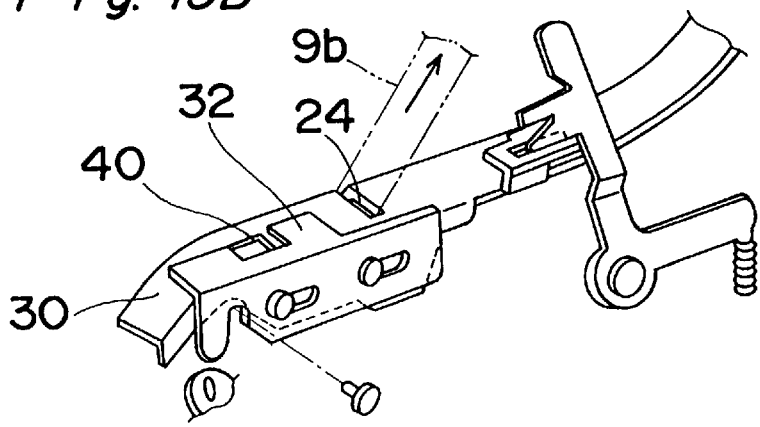
FIG. 15B is an enlarged perspective view of a part of the device.
Figure 15C:
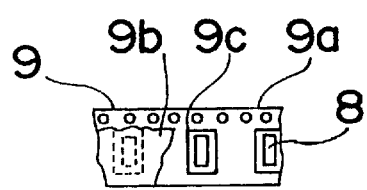
FIG. 15C is a plan view of the taping component.
Figure 15D:
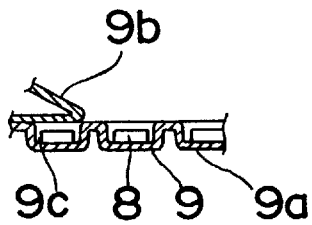
FIG. 15D is a sectional view of the taping component.
Figure 16:
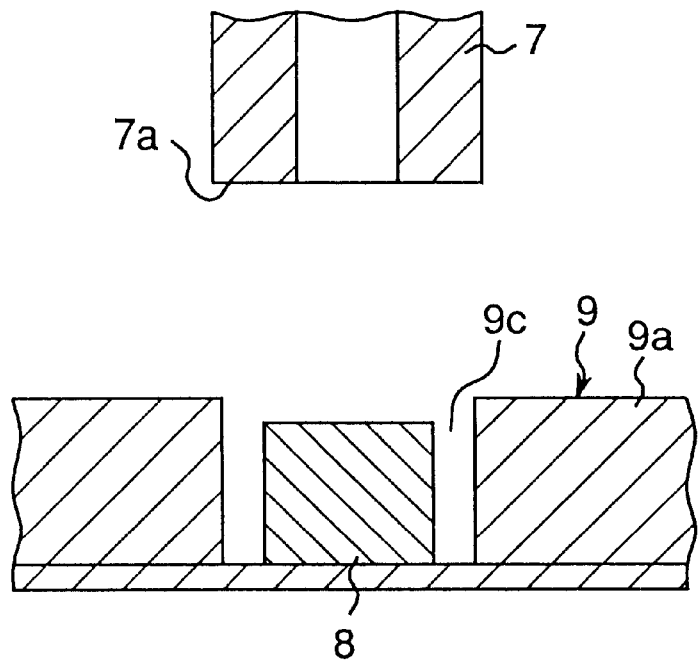
FIG. 16 is a sectional view of the suction nozzle and the tape base of a conventional component suction method when the suction nozzle descends.
Figure 17:
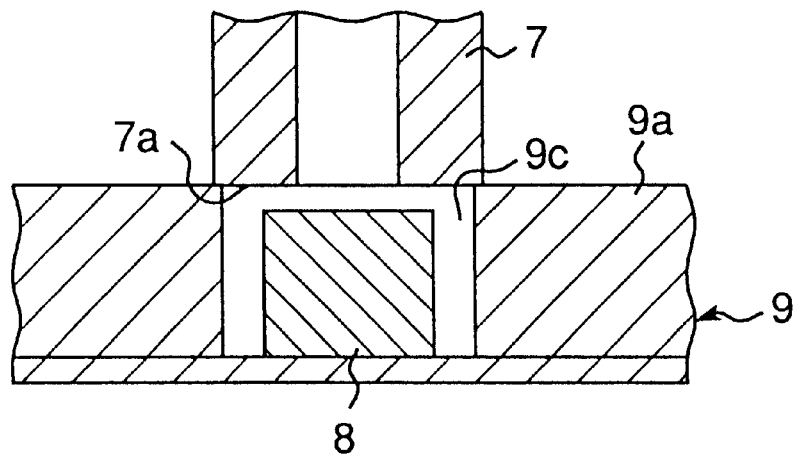
FIG. 17 is a sectional view of the suction nozzle and the tape base in the conventional method when the component is sucked.
Figure 18:
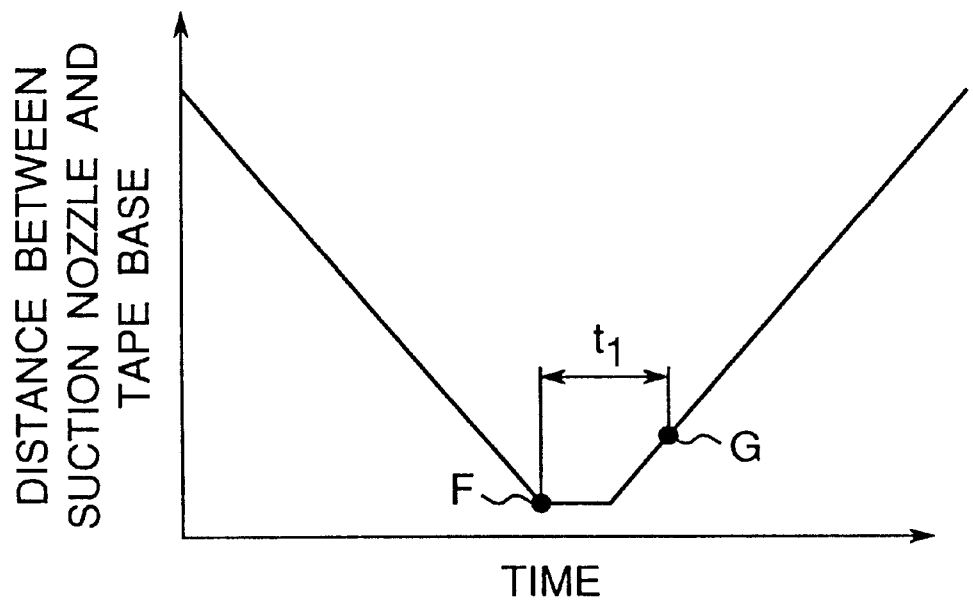
FIG. 18 is a graph showing the relationship between a distance of the suction nozzle and a tape base, and a time.
Figure 19:
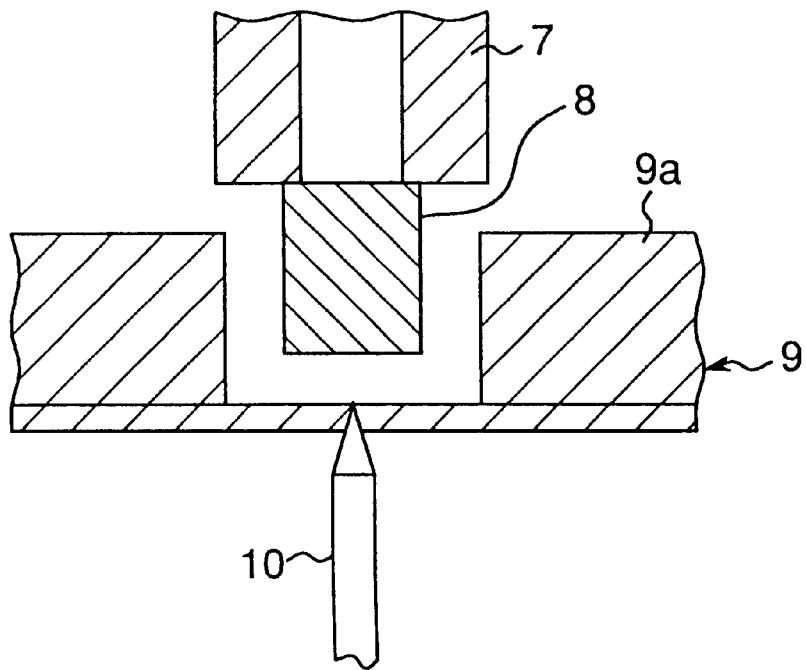
FIG. 19 is a sectional view of the nozzle and the tape base when a standing suction error occurs.
Figure 20:
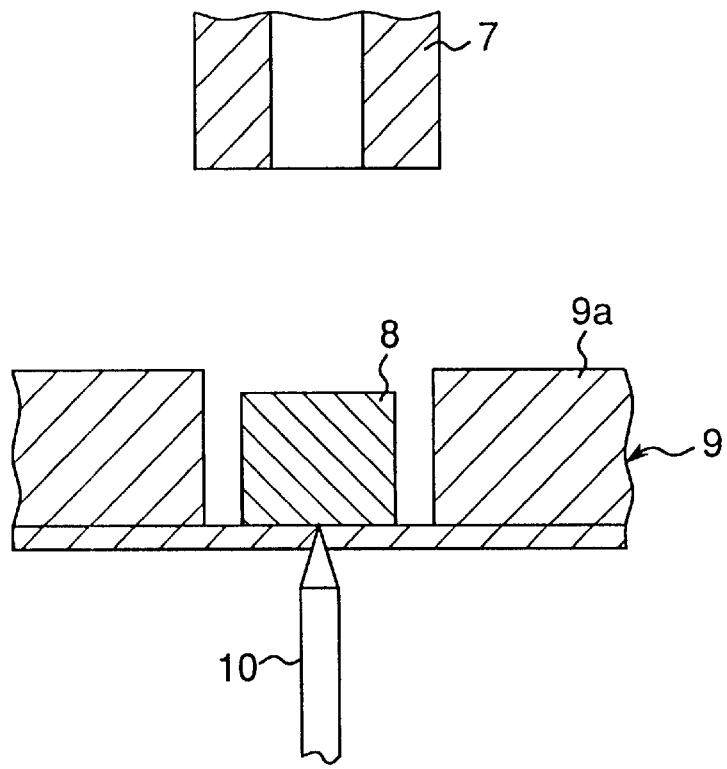
FIG. 20 is a sectional view of the suction nozzle and the tape base when a mis-suction error is brought about.
Figure 21:
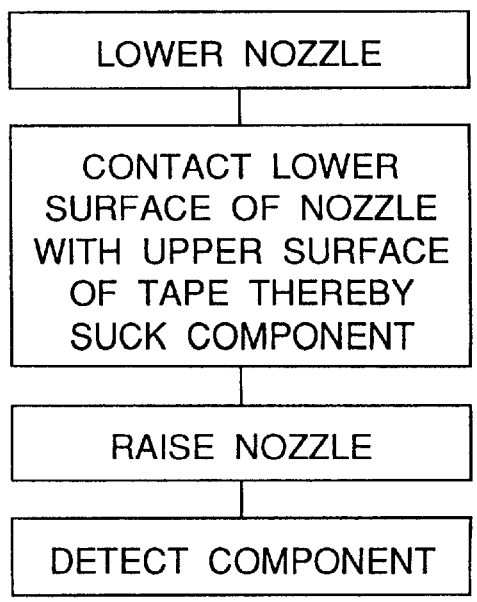
FIG. 21 is a flow chart of the conventional component suction method.
Figure 30:
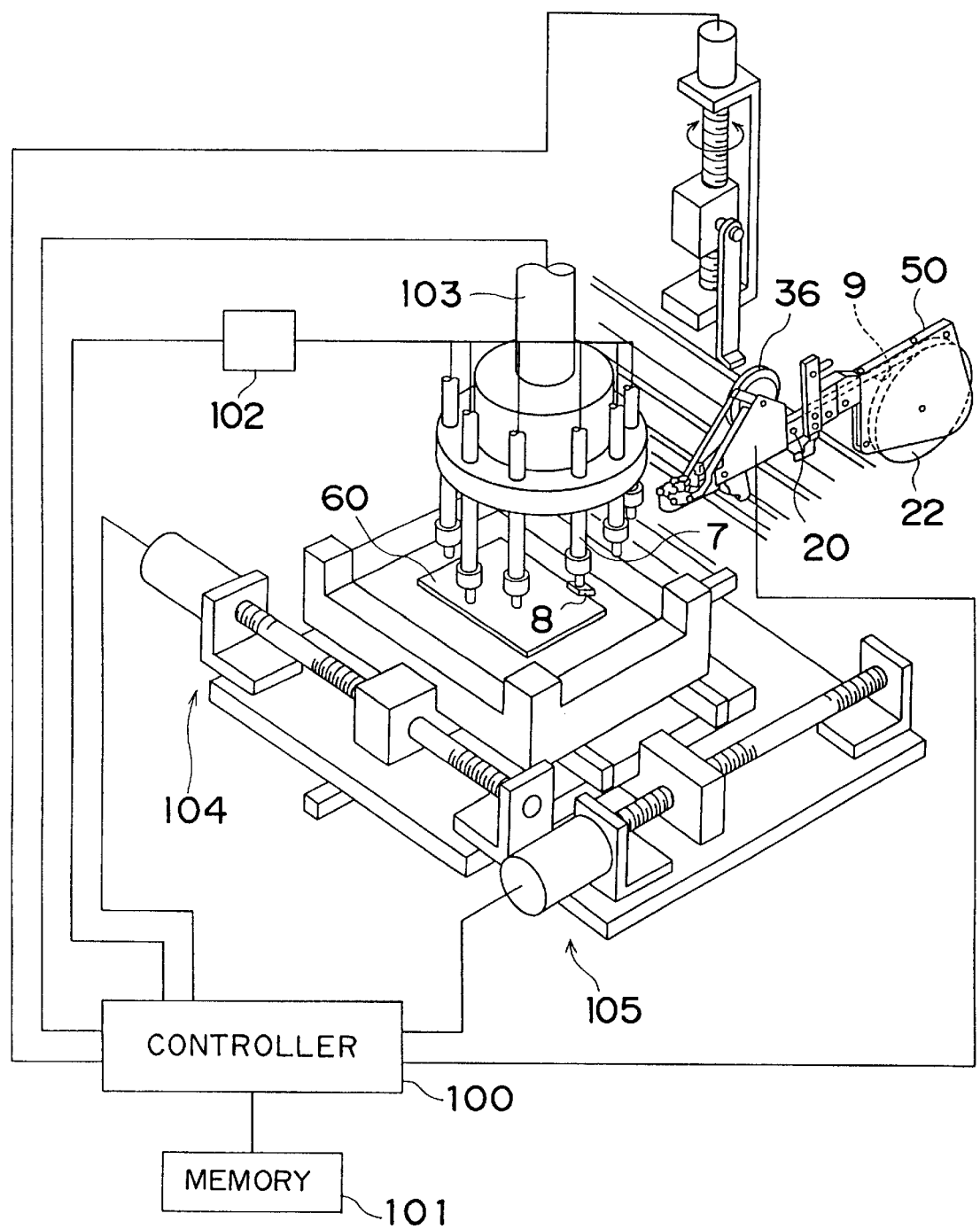
FIG. 30 is a perspective view of an example of a mounting apparatus used in the component suction method according to one embodiment of the present invention.
Figure 31:
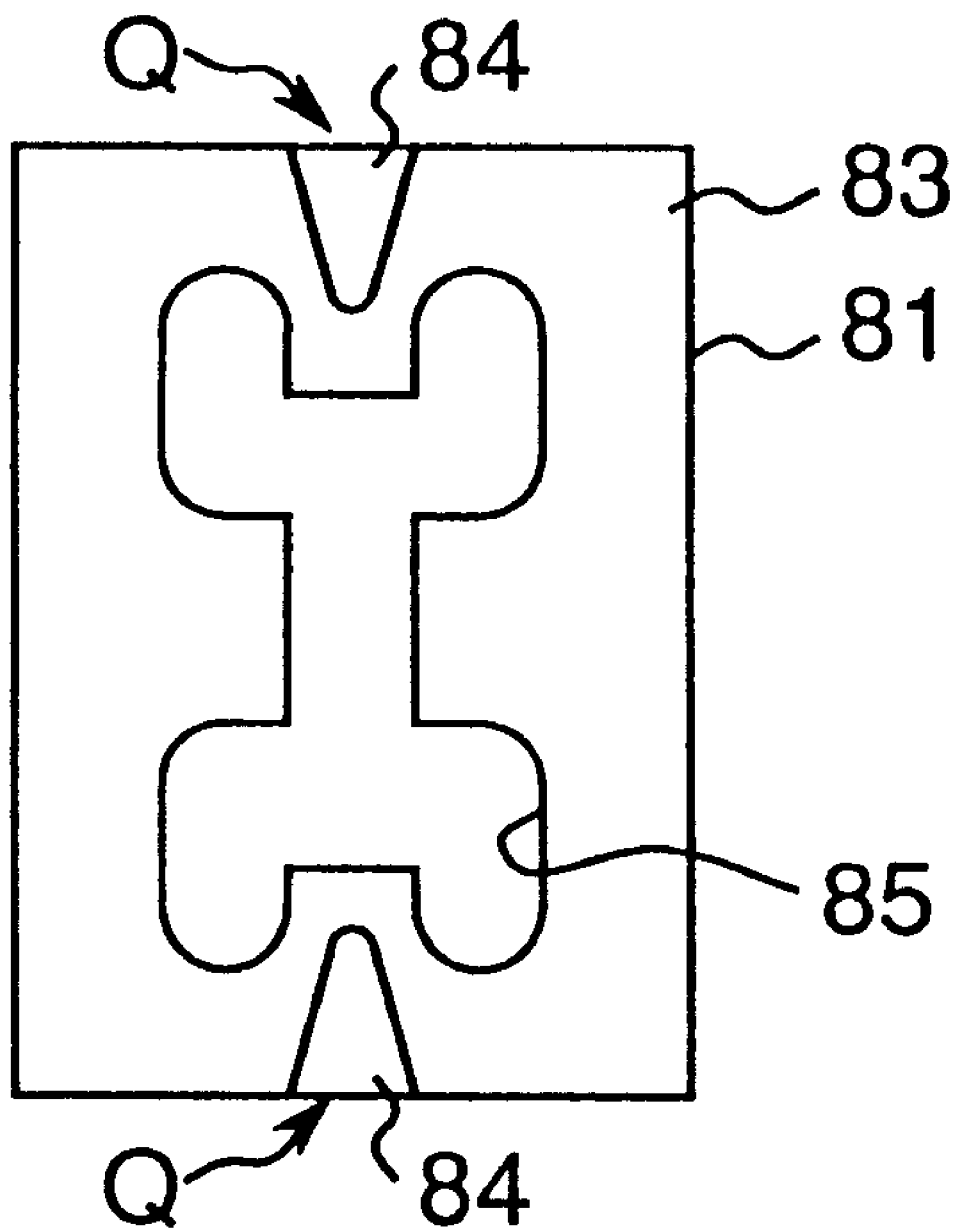
FIG. 31 shows a bottom view of the nozzle according to a modification of the embodiment.

A component suction method according to a preferred embodiment of the present invention will be described with the use of the flow chart of FIG. 1. In FIG. 1, numbers 1–6 represent respectively a step of lowering a suction nozzle (nozzle), a step of stopping the suction nozzle with a predetermined distance from an upper surface of a tape base, a step of carrying out, vacuum-suction after the stop of the suction nozzle has been stopped, a pushing an undersurface of a component up from below by a push pin, a step of sucking the component by the suction nozzle, and a step of transferring/mounting the component to a predetermined position by the suction nozzle. In executing the component suction method, a mounting apparatus shown in FIG. 30 and a component feed device shown in FIGS. 30 and 15A are used.

Fundamental points in the flow chart will be described in detail with reference to FIGS. 2A–2B and, 3–8.

Figure 2A:
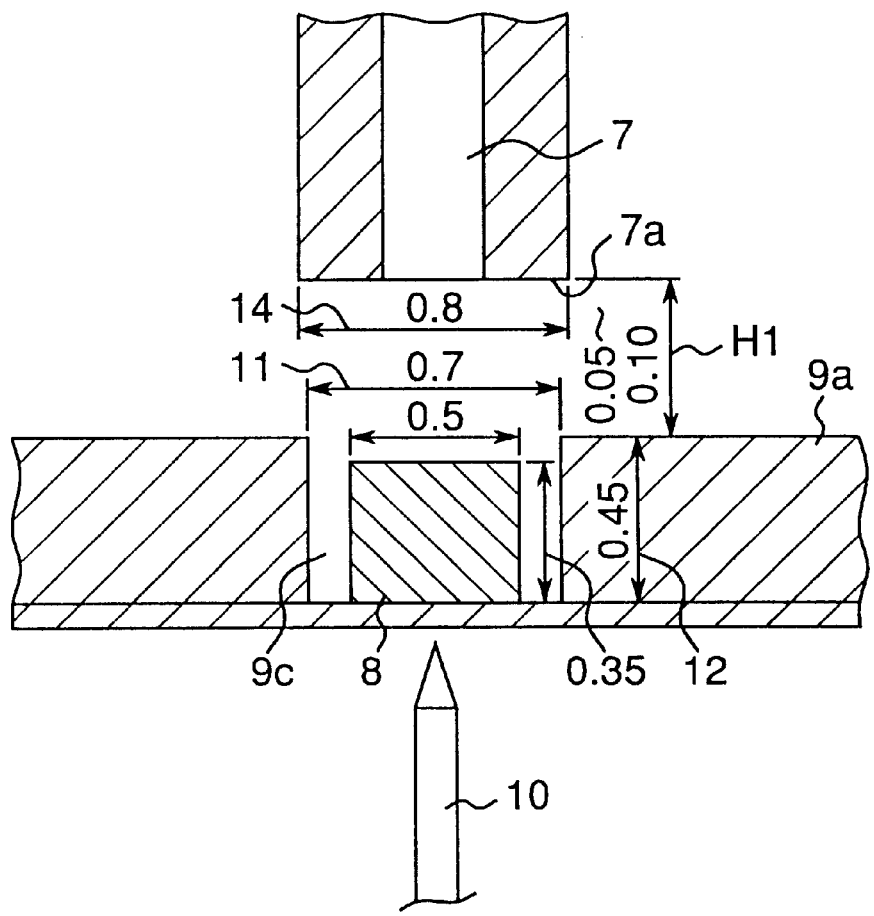
FIG. 2A is a sectional view of suction nozzle and a tape base.
Figure 2B:
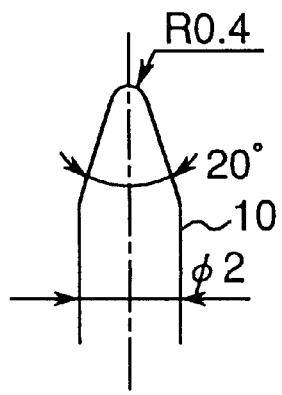
FIG. 2B is an enlarged view of a push pin.

FIG. 2A is a sectional view in an advancing direction of a tape base applied to a 1.0 mm long×0.5 mm wide×0.35 mm high component 8. The component 8 is accommodated in each of component storage sections 9c, which are formed at a predetermined intervals in a paper tape base (or a resin tape base) 9a (constituted of a 0.45 mm thick main tape and a bottom tape bonded to a rear face of the main tape in FIG. 2A). A width 11 of the storage section 9c is 0.7 mm and a depth 12 of the storage section 9c is 0.45 mm. An outer dimension 14 of a suction nozzle 7 is 0.8 mm. The nozzle descends and then stops while maintaining a distance H1 from the tape base 9a. The distance H1 is selected from 0.02–0.30 mm, particularly preferably from 0.05 mm–0.10 mm. A push pin 10 pushes an undersurface of the component 8 upwardly from below the component. Although a needle-like push pin having a diameter of 2 mm as shown in FIG. 2B is used in the embodiment, any form of a push pin will do so long as it pushes up the component from below. Although a component assembly (taping component) 9 shown in FIGS. 15A–15D is most suitable, needless to say, the component assembly is not limited to FIGS. 15A–15D.

Figure 3:
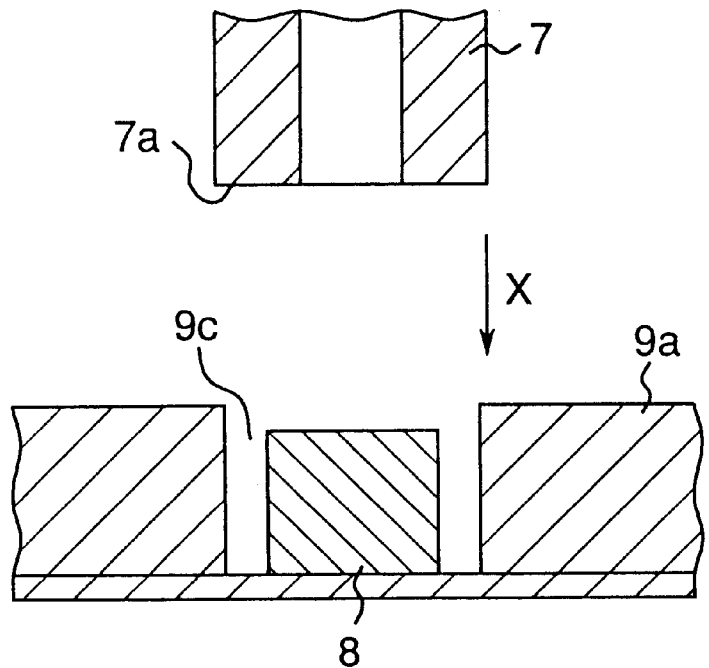
FIG. 3 is a sectional view of the suction nozzle and the tape base in a process when the suction nozzle descends.
Figure 4:
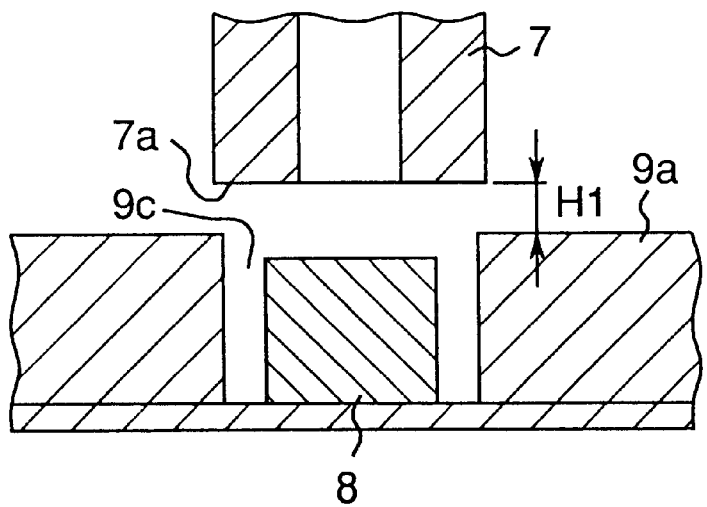
FIG. 4 is a sectional view of the suction nozzle and the tape base when the suction nozzle stops.
Figure 5:
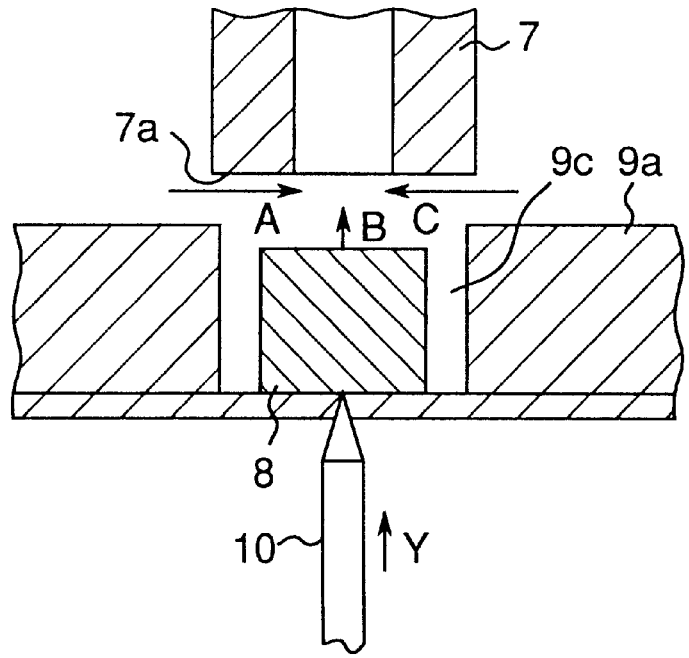
FIG. 5 is a sectional view of the suction nozzle and the tape base when the suction is started.

FIG. 3 shows a process wherein the suction nozzle 7 descends. The suction nozzle 7 descends from above in a direction of an arrow X. FIG. 4 shows a state where the suction nozzle 7 stops at the predetermined distance H1 from the upper surface of the tape base 9a. More specifically, a lower surface 7a of the suction nozzle 7 is separated the predetermined distance H1 from the upper surface of the tape base 9a. FIG. 5 indicates a state where the vacuum suction is started after the stop of the suction nozzle 7. The vacuum suction produces flows of the air in directions of arrows A, B, and C in the periphery of the suction nozzle 7 and inside the component storage section 9c, so that a pressure at an upper surface of the component 8 is decreased to be lower than a pressure at a lower surface of the component 8, which acts a force to float the component 8.

Figure 6:
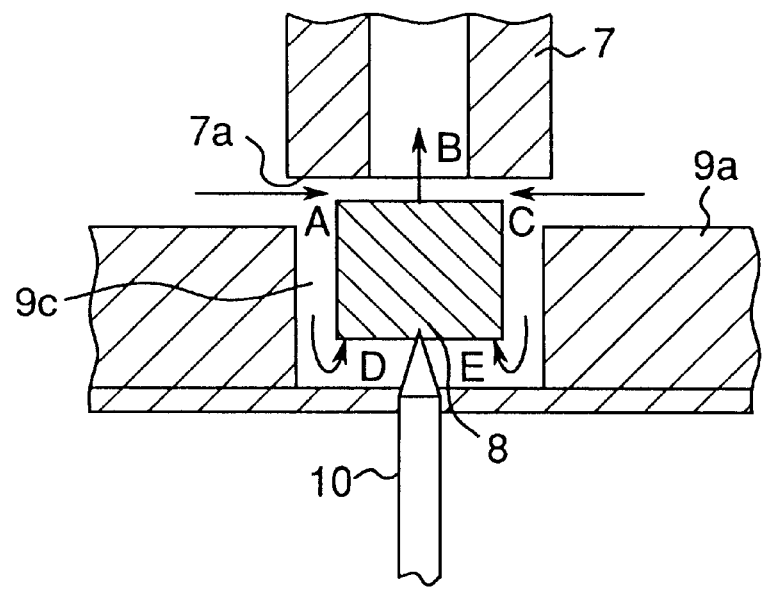
FIG. 6 is a sectional view of the suction nozzle and the tape base when the component is pushed up by the push pin.
Figure 7:
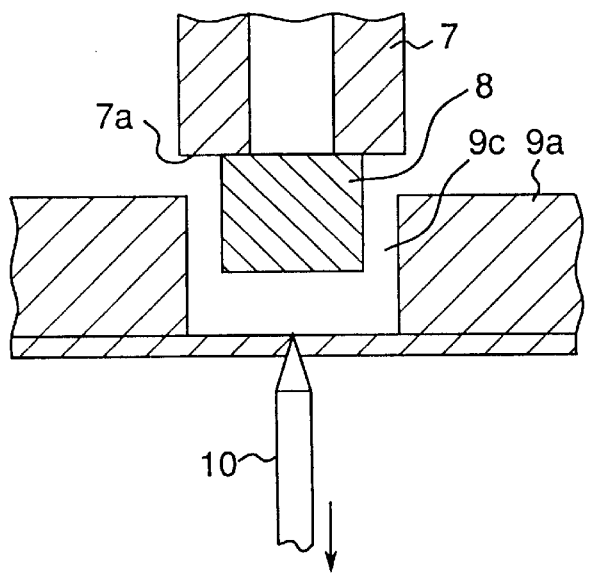
FIG. 7 is a sectional view of the suction nozzle and the tape base when the suction is completed.

The vacuum suction may be conducted before the suction nozzle 7 stops. The push pin 10 starts to move in a direction of an arrow Y near a bottom dead center of the suction nozzle 7. FIG. 6 illustrates a state where the push pin 10 pushes the component 8 up from below. When the component 8 is pushed up by the push pin 10, flows of the air are generated in directions of arrows A–E in the periphery of the suction nozzle 7 and inside the S component storage section 9c. A pressure difference between the upper and lower surfaces of the component 8 is furthermore increased in comparison with that in FIG. 5, and therefore a much larger force acts to float the component 8. Accordingly, the component 8 is securely sucked to the lower surface 7a of the suction nozzle 7. Suction failures are hence greatly prevented and the component 8 can be quickly and stably sucked. FIG. 7 shows a state where the component 8 is completely sucked. Since the suction nozzle 7 continues the vacuum suction even after sucking the component 8, the component 8 is held by the suction nozzle 7. Then, the component 8, sucked by the suction nozzle 7, is moved and mounted to a predetermined position of a circuit board. Although the push pin 10 is used to push up the component 8 from below in order to operate facilitate application of the larger force to float the component 8 in the embodiment, it is not always necessary to push up the component 8 by the push pin 10 because the floating force is generated by maintaining the predetermined distance H1 between the lower surface 7a of the suction nozzle and the upper surface of the tape base 9a when the suction nozzle 7 stops. In case the tape base 9a has a different thickness, the thickness is stored beforehand and then, the bottom dead center of the suction nozzle 7 is obtained by calculations so that a distance between the lower surface 7a of the suction nozzle 7 and the upper surface of the tape base 9a at the bottom dead center of the suction nozzle 7 becomes the predetermined distance H1.

Figure 8:
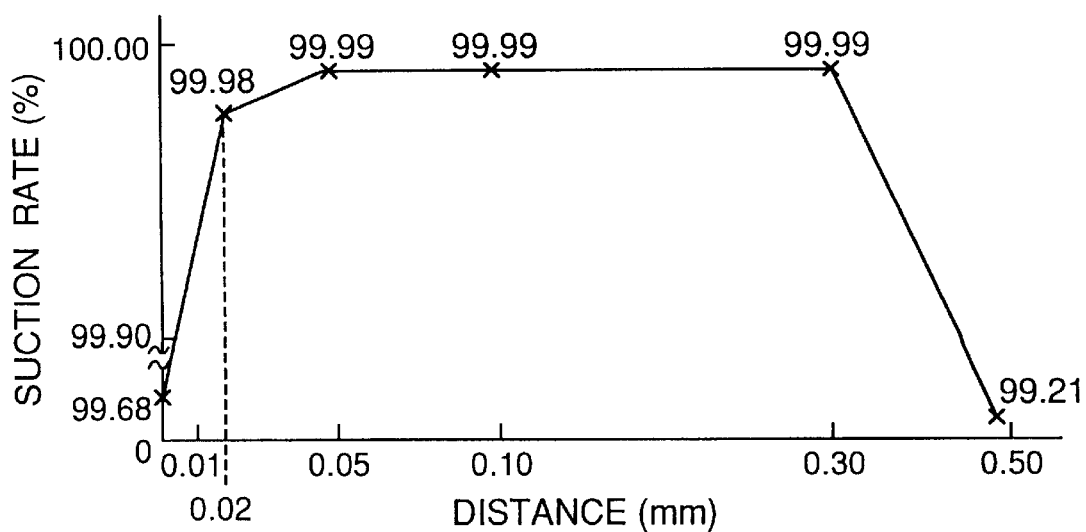
FIG. 8 is a graph of the relationship between a distance of a lower surface of the suction nozzle and the tape base, and a suction rate.

FIG. 8 shows the relationship between the above distance H1 and a suction rate. The graph of FIG. 8 is made based on a result which is obtained by using a mounting apparatus to suck ten thousand or more electronic components. The suction rate is 99.98% at the distance H1 of 0.02 mm and the suction rate is 99.99% at the distance from 0.05 mm to 0.30 mm. Therefore, in order to ensure the suction rate of 99.95% or more, the distance is preferably selected from a range of 0.02 mm–0.30 mm. To provide even more certainty, the distance H1 is particularly preferably selected from 0.05 mm–0.10 mm.

In the present embodiment, there is secured the predetermined distance H1 between the lower surface 7a of the suction nozzle and the upper surface of the tape base 9a at the bottom dead center of the suction nozzle 7. On the other hand, if projecting parts 63 of a predetermined height are provided at the suction nozzle 7 as in FIG.13, a predetermined distance H2 can be provided between the lower surface 7a of the suction nozzle 7 and the upper surface of the tape base 9a.

In order to obtain the aforementioned predetermined height H2, a distance formation spacer may be extended from the retainer cover 30 (FIGS. 15A and 15B) to the component feed opening 40.

The predetermined distance H1 between the lower surface 7a of the suction nozzle and the upper surface of the tape base 9a is set so as to facilitate the flows of the air in the embodiment. In order to obtain the same effect as this, an air path can be formed in the tape base 9a.

Figure 9:
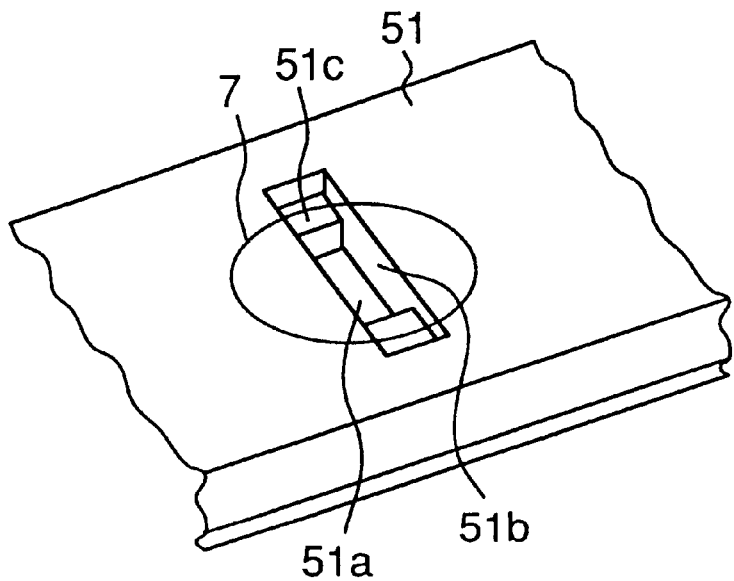
FIG. 9 is a perspective view when a component storage section of a taping component is provided with a first space and a second space.
Figure 10:
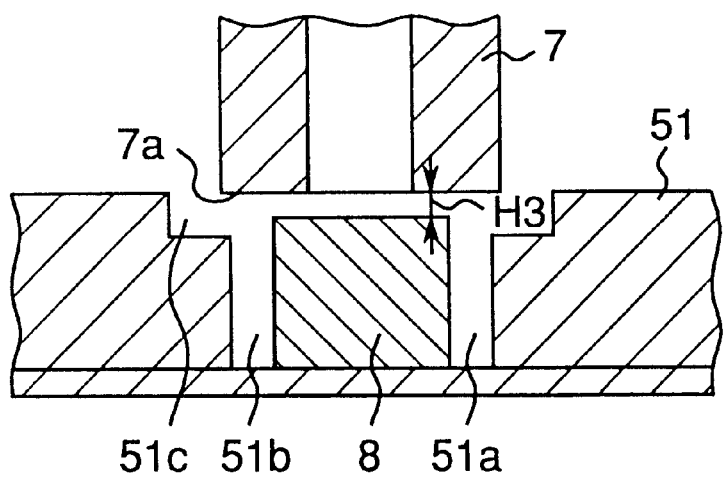
FIG. 10 is a sectional view of the suction nozzle and the tape base of FIG. 9.

More specifically, in an embodiment of FIGS. 9 and 10, a plurality of component storage sections 51a for storing components 8 are formed in a tape base 51. The component storage section 51a consists of a first space 51b and a second space 51c. The component 8 is accommodated in the first space 51b, with an upper surface thereof slightly projecting up from the first space 51b. The second space 51c is located above the first space 51b and is so formed as to expand to both sides. The second space 51c is formed to a height that is higher than the upper surface of the component 8. Therefore, the lower surface 7a of the suction nozzle 7 is not in touch with the component 8 when the suction nozzle 7 contacts the tape base 51 as indicated by a circle in FIG. 9. A distance H3 between the lower surface 7a of the suction nozzle 7 and the component 8 is preferably about 0.02–0.30 mm. Although the upper surface of the component 8 protrudes up from the first space 51b in the embodiment of FIGS. 9 and 10, the component 8 may be recessed in the first space 51b.

In the above-described embodiment, the second space 51c is formed to expand sideways (either in a longitudinal direction of the tape base 51 or in a widthwise direction of the tape base 51) beyond a position where the lower surface 7a of the suction nozzle contacts the tape base 51. The second space 51c constitutes the air path to allow the air to flow easily between the first space 51b where the component 8 is stored and the outside. Even when the component 8 is vacuum-sucked while the suction nozzle is held in touch with the tape base 51, the air readily enters the component storage section 51a, thereby increasing the pressure difference between the upper and lower surfaces of the component 8. Eventually a large force acts to float the component 8. If the component 8 is pressed up from below by a push pin simultaneously when the component is vacuum-sucked, similar to FIGS. 5–7, the force to float the component 8 is increased, whereby suction failures are largely prevented.

Figure 11:
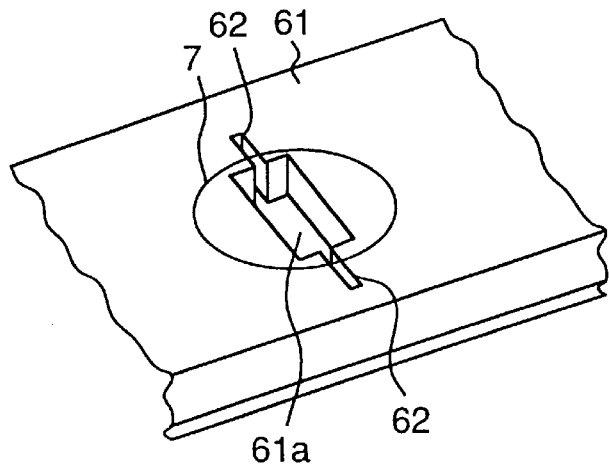
FIG. 11 is a perspective view when an air take-in groove is formed in the component storage section of the taping component.
Figure 12:
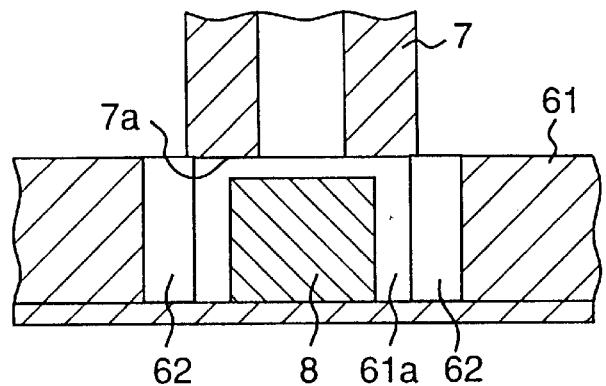
FIG. 12 is a sectional view of the suction nozzle and the tape base of FIG. 11.

Another embodiment will be discussed with reference to FIGS. 11 and 12. A tape base 61 is provided with a plurality of component storage sections 61a for storing components 8. Air take-in grooves 62 communicate with the component storage sections 61a, which are formed so that the lower surface 7a of the suction nozzle 7 does not cover the whole face of the component storage section 61a when the suction nozzle 7 comes in touch with the tape base 61 as shown by a circle in FIG. 11. Because of this arrangement, the air is allowed to flow into the component storage section 61a through the air take-in grooves 62 at the time of the vacuum-suction by the suction nozzle 7.

As described hereinabove, in the embodiment, each of the air take-in grooves 62 is opened sideways (either in the longitudinal direction or in the widthwise direction of the tape base 61) beyond a position where the lower surface 7a of the suction nozzle contacts the tape base 61, thus constituting the air path for the air to run easily between the component storage section 61a and the outside. Even when the component 8 is vacuum-sucked in a state while the suction nozzle 7 is in touch with the tape base 61, the air is able to easily enter the component storage section 61a, thereby increasing the pressure difference between the upper and lower surfaces of the component 8 so as to provide a large force to float the component 8. Similar to the embodiment of FIGS. 5–7, if the component 8 is pushed up from below by a push pin simultaneously when the component is vacuum-sucked, suction failures can be greatly avoided.

In any of the embodiments of FIG. 13, FIGS. 9–10 and FIGS. 11–12, a position where the projecting part of the nozzle or the lower surface of the nozzle contacts the upper surface of the tape base is the bottom dead center of the nozzle, and therefore the bottom dead center can be positioned easily. The same effect as in the above embodiments can be achieved even when the bottom dead center of the nozzle is set at a position adjacent to the upper surface of the tape base. In this case, the distance H2 defined by the projecting parts 63 becomes slightly larger (FIG.13), a gap between the nozzle 7 and the upper surface of the tape base 51 is added to the air path by the second space 51c (FIG. 10), a gap between the nozzle 7 and the upper surface of the tape base 61 is added to the air paths formed by the air take-in grooves 62 (FIG. 12), such that the amount of the air flowing into the component storage section can be increased. Even if the bottom dead center of the nozzle is positioned at a position adjacent to the upper surface of the tape base because of a rough and approximate control, resulting in contacting of the nozzle 7 against the tape base, shocks at the contacting time are eased by the cushioned tape base and also the air flow to the component storage section is secured by the air path or the like.

Figure 13:
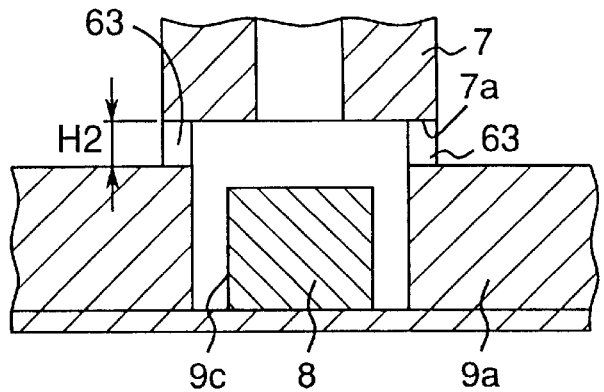
FIG. 13 is a sectional view of the suction nozzle and the tape base when projecting parts are provided at a lower surface of the suction nozzle.
Figure 14:
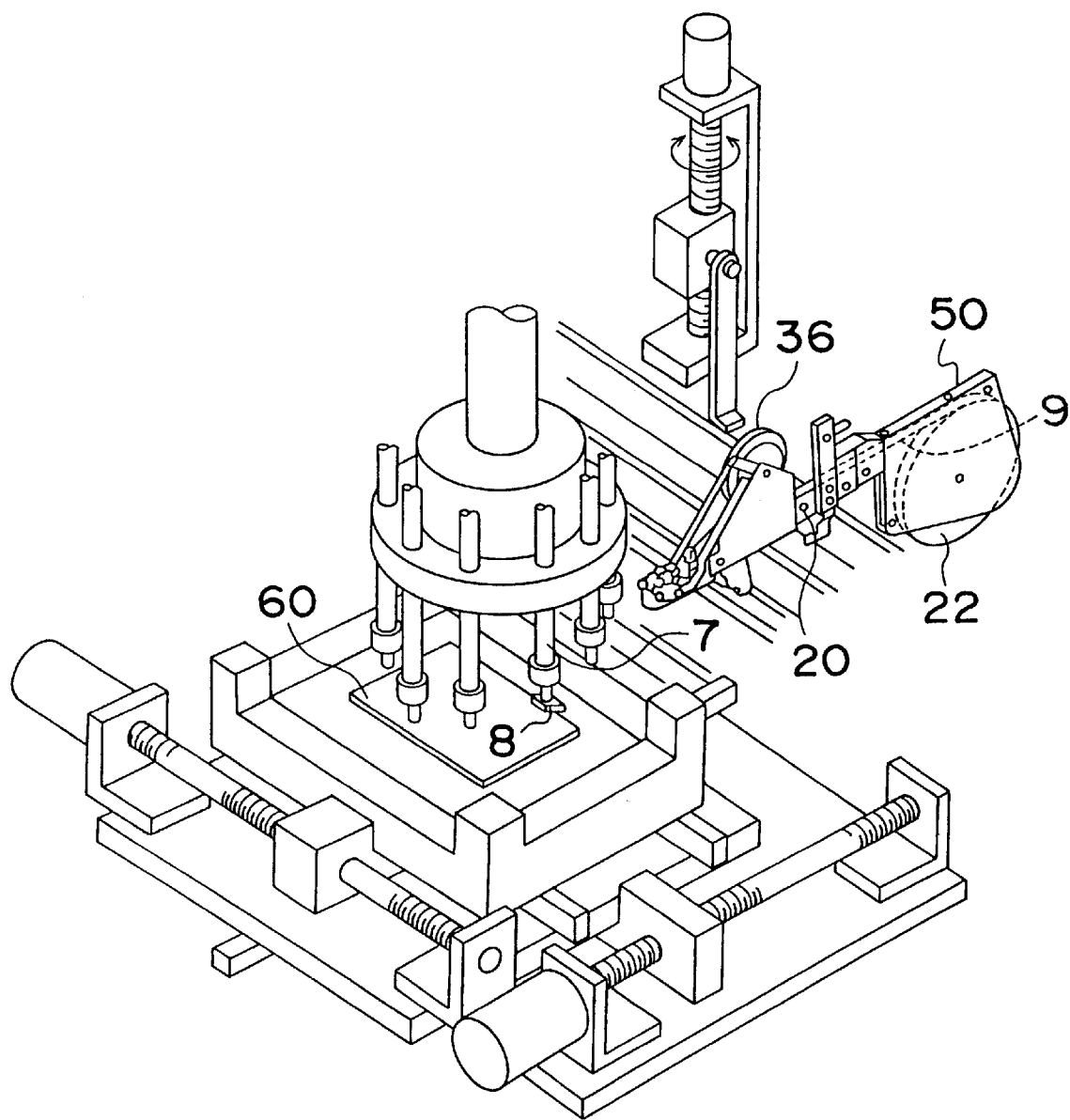
FIG. 14 is a perspective view of an example of a mounting apparatus used in the component suction method.
Figure 22A:
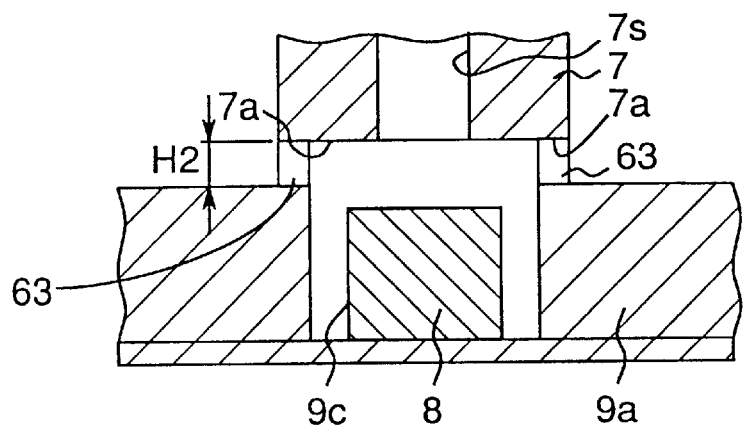
FIG. 22A is a sectional view of the suction nozzle and the tape base in a different embodiment of the component suction method of the present invention.
Figure 22B:
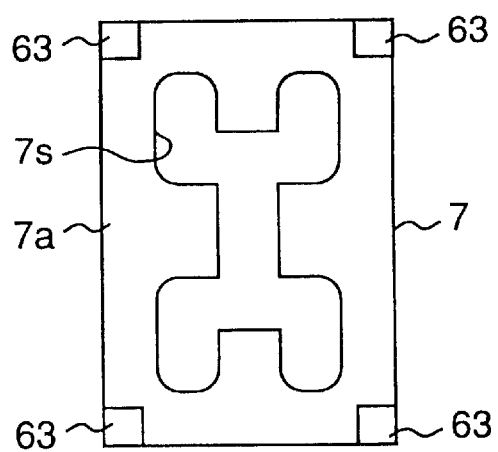
FIG. 22B is a bottom view of the suction nozzle of FIG. 22A.
Figure 22C:
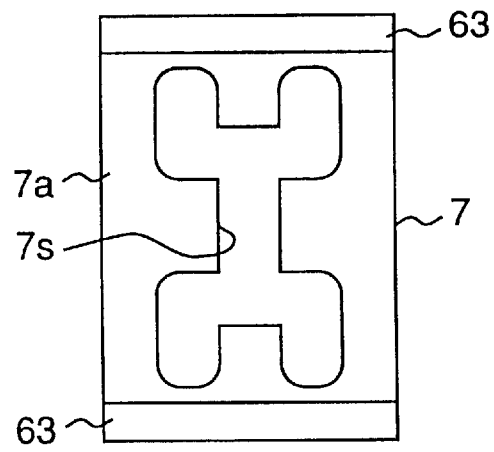
FIG. 22C is a bottom view of a modified suction nozzle.

FIGS. 22A–22C are a modification of the embodiment of FIG. 13, wherein the projecting parts 63 are formed at the lower surface 7a of the suction nozzle 7 in a rectangular cross section. The projecting part 63 may be formed at four corners of the lower surface 7a of the nozzle as indicated in FIGS. 22A and 22B, or the band-like projecting part 63 may be formed at two opposite sides of the lower surface 7a of the nozzle as in FIG. 22C. The suction nozzle 7 of FIGS. 22A–22C has a suction opening 7s with a cross section as shown in FIGS. 22B and 22C. However, the suction opening 7s may be shaped in various other forms.

Figure 23:
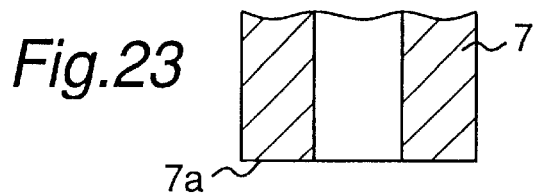
FIG. 23 is a sectional view of the suction nozzle and the tape base of an embodiment when a hole is opened in a lower surface of the tape base.

A different embodiment of the present invention will be described with reference to FIG. 23. The embodiment comprises a first step of feeding the component 8 contained in a component storage section 71a of a tape base 71 every predetermined distance to a predetermined position, a second step of lowering the suction nozzle 7 capable of sucking the component 8 sent to the predetermined position, a third step of stopping the nozzle 7 at a position where the nozzle contacts an upper surface 71b of the tape base or at a position adjacent to this position, a fourth step of vacuum-sucking the component 8 by the suction nozzle 7 at a bottom dead center or a position adjacent to the center, and a fifth step of moving the component 8 sucked by the nozzle 7 to a predetermined position after the fourth step. The method is adapted to permit air to flow into the component storage section through the air path formed in the tape base 71 when the component 8 is vacuum-sucked by the nozzle 7, which is the same as in the embodiments of FIGS. 9–10 and 11–12. Meanwhile, it is a characteristic feature of the embodiment that the air path is constituted of a hole 71d formed in a lower surface 71c of the tape base 71 before the component 8 is vacuum-sucked by the nozzle 7.

The hole 71d is formed by a boring pin 101 operating subsequent to the descending motion of the nozzle 7. The air flows into the component storage section 71a through the hole 71d when the nozzle 7 carries out the vacuum-suction. The component 8 is accordingly effectively floated and sucked securely to a bottom face 7a of the nozzle.

It is preferable to utilize the push pin 10 mentioned earlier as the boring pin 101. In using the push pin 10, the push pin 10 is moved up and down when the nozzle 7 starts to descend, thereby forming the hole 71d, which is a first action. Then the push pin 10 is moved up after the nozzle 7 starts vacuum-sucking, thereby pushing the component 8 up, which is a second action.

A still different embodiment of the present invention will be described with reference to FIGS. 24A–24C. The embodiment of FIGS. 24A–24C comprises a first step of feeding the component 8 that is accommodated in a component storage section 9c of a tape base 9a to a predetermined position, a second step of lowering a nozzle 81 capable of sucking the component 8 supplied to the predetermined position, a third step of stopping the nozzle 81 at a position where the nozzle contacts an upper surface 9d of the tape base or a position adjacent to the above position, a fourth step of pushing the component 8 up from below by the push pin 10 when the nozzle 81 is at a bottom dead center or a position adjacent to the center, a fifth step of vacuum-sucking by the nozzle 81 the component 8 at the bottom dead center or the position adjacent to the center, and a sixth step of moving the component 8 sucked by the nozzle 81 to a predetermined position after the fifth step. Moreover, the embodiment is characterized in that the air is let in the component storage section 9c through an air path(s) formed in the nozzle 81 when the nozzle 81 vacuum-sucks the component 8, and the air paths are formed of notched parts 84 in the nozzle 81 connecting side faces 82 with a bottom face 83 of the nozzle.

Figure 24A:
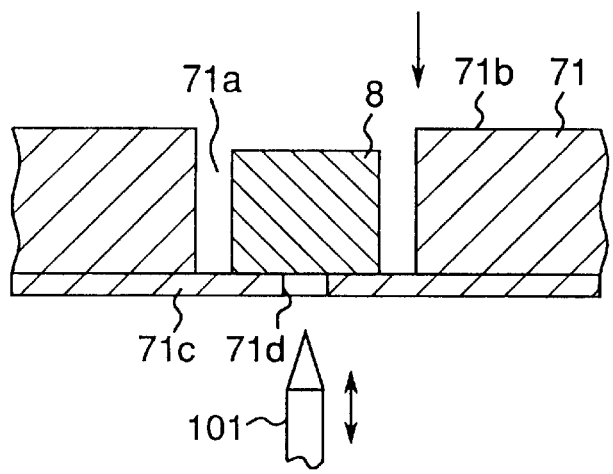
FIG. 24A is a sectional view of the nozzle and the tape base of an embodiment wherein a notched part is provided in the suction nozzle.
Figure 24B:
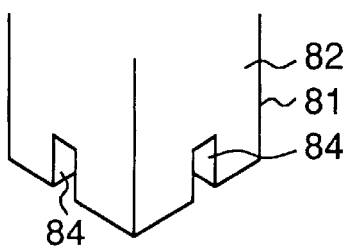
FIG. 24B is a perspective view of the suction nozzle.
Figure 24C:
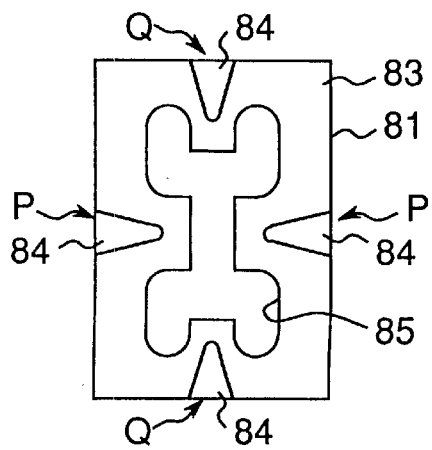
FIG. 24C is a bottom view of the nozzle.
Figure 25A:
FIGS. 25A, 25B, 25C, and 25D show modified examples of the notched part of the suction nozzle.
Figure 25B:
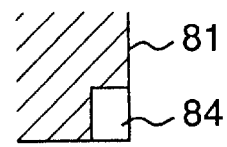
Figure 25C:
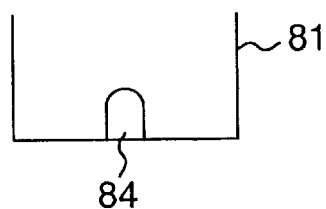
Figure 25D:
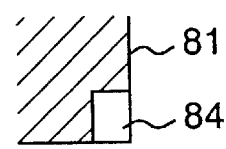
Figure 26A:
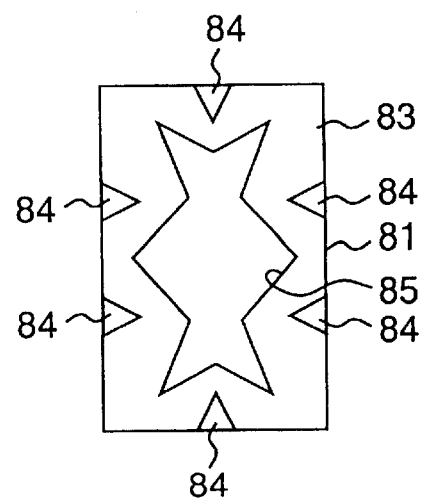
FIGS. 26A and 26B are bottom views of the suction nozzle with modified notched parts.
Figure 26B:
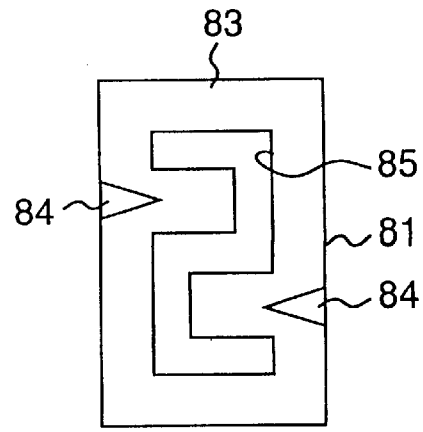

The nozzle 81, shown in FIG. 24A, has a suction opening 85 shaped as in FIG. 24C. Taking the shape of the suction opening 85 into consideration, the notched part 84 is formed at four points, namely, central parts P, P of both long sides and central parts Q, Q of both short sides of the nozzle 81 into a shape shown in FIGS. 24A and 24C. A count and a location of the notched parts 84 are not limited to that shown in FIGS. 24A–24C. For example, two notched parts can be formed at P and P, or Q and Q, or only one notched part may be formed at one of P and P, or only one notched part may be formed at Q and Q, or in the like manner. The notched part 84 may be shaped in various ways, e.g., as represented by bottom views and longitudinal sectional views respectively at the left side and right side of FIGS. 25A through 25D. FIG. 30 shows an example of a modification of the embodiment wherein the two notched parts 84 are formed at Q and Q. Moreover, the notched part 84 may be arranged at a suitable position in accordance with the shape of the suction opening 85, for instance, as indicated in FIGS. 26A and 26B.

Figure 27A:
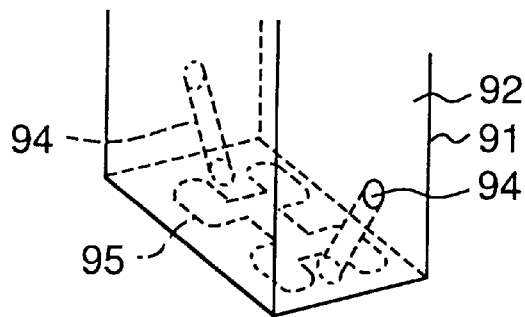
FIG. 27A is a perspective view of a suction nozzle in an embodiment where a hole is provided in the suction nozzle.
Figure 27B:
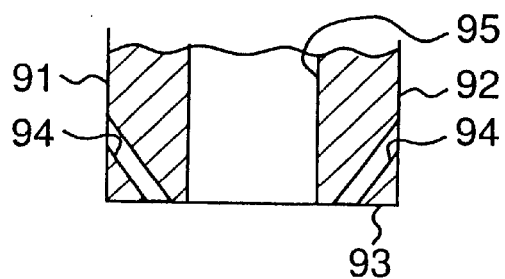
FIG. 27B is a sectional view of the suction nozzle.
Figure 27C:
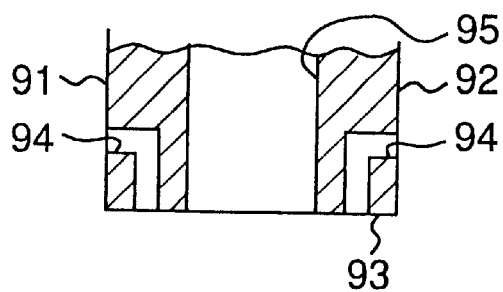
FIG. 27C is a sectional view of a suction nozzle of a modified example.

The air paths are the notched parts 84 in formed by the embodiment of FIGS. 24A–26B. Meanwhile, holes 94 are provided in FIGS. 27A–27C, which connect side faces 92 and a bottom face 93 of a nozzle 91 and function as the air paths. A shape of the hole 94 is determined with a shape of a suction opening 95 taken into account. The hole 94 may be linear as shown in FIGS. 27A and 27B or a bent hole as in FIG. 27C.

Figure 28:
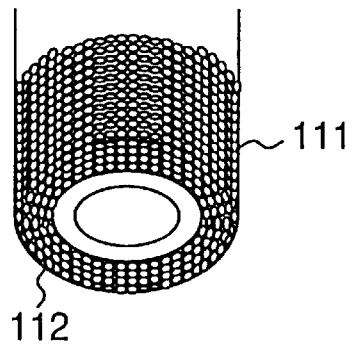
FIG. 28 is a perspective view of a suction nozzle in an embodiment wherein an outer peripheral part of the suction nozzle is formed of a porous material.

According to an embodiment of FIG. 28, an outer peripheral part 112 of a nozzle 111 is formed of a porous material and many through holes of the porous material work as the air paths.

The step of pushing up the component 8 by the push pin 10 may be omitted in the embodiments of FIGS. 24A–28.

A further embodiment of the present invention in FIGS. 29A and 29B will be discussed now. The embodiment comprises a first step of feeding the component 8 accommodated in a component storage section 122 of a tape base 121 to a predetermined position, a second step of lowering a nozzle 123 capable of sucking the component 8 supplied to the predetermined position, a third step of stopping the nozzle 123 at a position where the nozzle contacts an upper surface of the tape base or at a position adjacent to the above position, a fourth step of pushing the component 8 up from below when the nozzle 123 is at a bottom dead center position or at a position adjacent to the center, a fifth step of vacuum-sucking the component 8 at the bottom dead center position or at the position adjacent to the center, and a sixth step of moving the component 8 sucked by the nozzle 123 to a predetermined position after the fifth step. The component storage section is constructed so as to produce parts 124 not overlapping with an outline of a bottom face of the nozzle, thereby letting the air therein through the parts 124 when the nozzle vacuum-sucks the component.

Figure 29A:
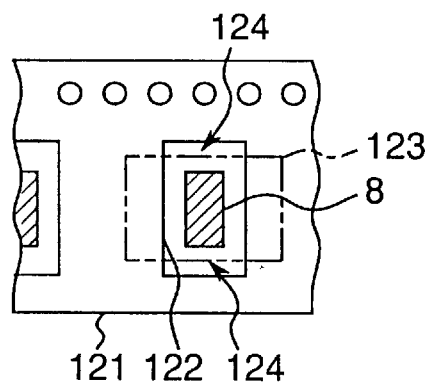
FIGS. 29A and 29B are plan views of the component suction method of the present invention in accordance with a further different embodiment.
Figure 29B:
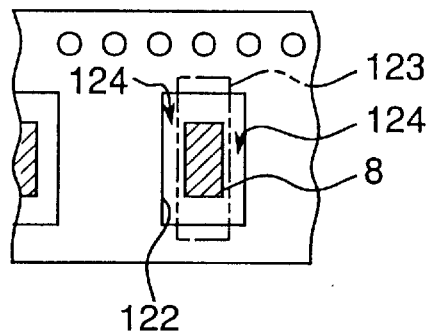

The parts 124 can be formed at both end portions in a widthwise direction of the component storage section 122 as in FIG. 29A, or at front and rear end portions in an advancing direction of the tape base of the component storage section 122 as in FIG. 29B. A suitable amount of the air is sent into the component storage section 122 by properly selecting a shape and a mounting posture of the nozzle 123, a shape of the component storage section 122, etc. In the instant embodiment, the fourth step of pushing the component 8 up from below may be eliminated.

FIG. 30 shows a mounting apparatus which can perform the above methods of the embodiments, having the nozzle 7, 81, 91, 111, 123 for vacuum-sucking components 8 from component storage sections 9c, 51a, 61a, 71a, 122 of a component feed device, holding the component 8 and mounting the component 8 to a predetermined position of a board 60, wherein an air path is formed in the nozzle to allow air to flow into the component storage section when the nozzle vacuum-sucks the component 8. The above operations are controlled by a controller 100 based on data stored in a memory 101. That is, the controller 100 controls a driving and sucking device 102 for moving up and down the nozzles and vacuum-sucking the components 8, a rotating device 103 for rotating the nozzles between the component sucking position and the component mounting position, driving devices 104 and 105 for moving the board 60 in X and Y directions perpendicular to each other, and the tape cassette device 50 for feeding one of the components 8 accommodated in the component storage sections thereof. The memory 101 stores the distances H1–H3 calculated by an operating part in the controller 100 or stored through an input device which are utilized to stop the nozzle.

According to the component suction method of the present invention, the air flow is reliaby obtained to float the component when vacuum-sucked, so that the component can be quickly and surely sucked while suction failures are prevented. When the component is pushed up from below by the push pin at the time of the vacuum suction, the component can be more reliably sucked. The present invention provides the component assembly, the mounting apparatus and the component feed device for carrying out the suction method.

The entire disclosure of Japanese Patent Application No. 8-38086 filed on Feb. 26, 1996 and Japanese Patent Application No. 8-170902 filed on Jul. 1, 1996, including specifications, claims, drawings, and summaries are incorporated herein by reference in their entireties.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component suction method comprising:
   feeding components accommodated in component storage sections of a tape base to a predetermined component sucking position;
   lowering a nozzle capable of sucking one of the components supplied to the component sucking position;
   stopping the nozzle at a position where the nozzle contacts an upper surface of the tape base or where the nozzle is adjacent to the upper surface of the tape base;
   pushing an undersurface of the one of the components up when the nozzle is at a bottom dead center or a position adjacent to the upper surface of the tape base;
   vacuum-sucking the one of the components with the nozzle at the bottom dead center or with the nozzle at the position adjacent to the upper surface of the tape base, wherein, when the nozzle vacuum-sucks the one of the components, air enters the component storage section through an air path formed in the nozzle; and
   moving the one of the components sucked by the nozzle to a predetermined position on a board after the vacuum-sucking operation.

2. A component suction method according to claim 1, wherein, during the vacuum-sucking operation the component storage section is covered with the nozzle and air passes through the air path into the component storage section.

3. A component suction method according to claim 1, wherein a lowermost end of the nozzle is defined by a planar surface.

4. A component suction method according to claim 1, wherein a notched part connecting a side face of the nozzle with a bottom face of the nozzle is formed so that the notched part becomes the air path.

5. A component suction method according to claim 1, wherein a hole connecting a side face of the nozzle with a bottom face of the nozzle is formed so that the hole becomes the air path.

6. A component suction method according to claim 1, wherein an outer peripheral part of the nozzle is formed of a porous material so that through holes of the porous material define the air path.

7. A component suction method comprising:
   feeding components accommodated in component storage sections of a tape base to a predetermined component sucking position;
   lowering a nozzle capable of sucking one of the components supplied to the component sucking position;
   stopping the nozzle at a position where the nozzle contacts an upper surface of the tape base or where the nozzle is adjacent to the upper surface of the tape base;
   vacuum-sucking the one of the components with the nozzle at a bottom dead center or with the nozzle at the position adjacent to the upper surface of the tape base, wherein, when the nozzle vacuum-sucks the one of the components, air enters the component storage section through an air path formed in the nozzle; and
   moving the one of the components sucked by the nozzle to a predetermined position on a board after the vacuum-sucking operation.

8. A component suction method according to claim 7, wherein, during the vacuum-sucking operation the component storage section is covered with the nozzle and air passes through the air path into the component storage section.

9. A component suction method according to claim 7, wherein a lowermost end of the nozzle is defined by a planar surface.

10. A component suction method according to claim 7, wherein the air path comprises a notched part connecting a side face of the nozzle with a bottom face of the nozzle.

11. A component suction method according to claim 7, wherein the air path is formed by a hole connecting a side face of the nozzle with a bottom face of the nozzle.

12. A component suction method according to claim 7, wherein an outer peripheral part of the nozzle is formed of a porous material so that through holes of the porous material define the air path.

* * * * *